US007968376B2

(12) United States Patent
Lee et al.

(10) Patent No.: US 7,968,376 B2
(45) Date of Patent: Jun. 28, 2011

(54) PACKAGED MICROELECTRONIC DEVICES AND METHODS FOR MANUFACTURING PACKAGED MICROELECTRONIC DEVICES

(75) Inventors: Teck Kheng Lee, Singapore (SG); Voon Siong Chin, Singapore (SG); Ai Chie Wang, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/564,417

(22) Filed: Sep. 22, 2009

(65) Prior Publication Data

US 2010/0029043 A1    Feb. 4, 2010

Related U.S. Application Data

(62) Division of application No. 12/183,981, filed on Jul. 31, 2008, now Pat. No. 7,612,436.

(51) Int. Cl.
*H01L 21/44* (2006.01)
(52) U.S. Cl. .................. 438/111; 438/112; 438/123
(58) Field of Classification Search .......... 438/110, 438/111, 112, 123–127; 257/666, 676
See application file for complete search history.

(56) References Cited

U.S. PATENT DOCUMENTS

| 5,126,821 | A | | 6/1992 | Okinaga et al. | |
|---|---|---|---|---|---|
| 5,409,866 | A | * | 4/1995 | Sato et al. | 438/123 |
| 5,457,340 | A | * | 10/1995 | Templeton et al. | 257/666 |
| 5,585,667 | A | * | 12/1996 | Asanasavest | 257/676 |
| 5,723,899 | A | * | 3/1998 | Shin | 257/666 |
| 6,569,727 | B1 | | 5/2003 | Casper et al. | |
| 6,627,976 | B1 | | 9/2003 | Chung et al. | |
| 6,838,751 | B2 | | 1/2005 | Cheng et al. | |
| 6,882,035 | B2 | | 4/2005 | Tatt et al. | |
| 6,903,448 | B1 | | 6/2005 | Sutardja et al. | |
| 6,921,967 | B2 | * | 7/2005 | Tzu et al. | 257/676 |
| 6,949,813 | B2 | | 9/2005 | Roohparvar | |
| 7,002,239 | B1 | | 2/2006 | Nadarajah et al. | |
| 7,375,415 | B2 | | 5/2008 | Lee et al. | |
| 7,667,309 | B2 | * | 2/2010 | Harnden et al. | 257/676 |
| 2003/0006492 | A1 | | 1/2003 | Ogasawara et al. | |
| 2003/0137042 | A1 | | 7/2003 | Mess et al. | |
| 2004/0201080 | A1 | * | 10/2004 | Basoor et al. | 257/666 |
| 2005/0073031 | A1 | | 4/2005 | Abe et al. | |

(Continued)

FOREIGN PATENT DOCUMENTS

JP        03195052 A    8/1991

(Continued)

OTHER PUBLICATIONS

Juskey, F., "Flip Chip on Standard Lead Frame: Laminate Performance at a Lower Cost," 2003 IEEE/CPMT/SEMI International Electronics Manufacturing Technology Symposium, Jul. 16-18, 2003, pp. 237-240.

(Continued)

*Primary Examiner* — Kevin M Picardat
(74) *Attorney, Agent, or Firm* — Perkins Coie LLP

(57) ABSTRACT

Packaged microelectronic devices and methods for manufacturing packaged microelectronic devices are disclosed herein. In one embodiment, a packaged microelectronic device can include a support member and at least one die in a stacked configuration attached to the support member. The support member may include a leadframe disposed longitudinally between first and second ends and latitudinally between first and second sides. The leadframe includes a lead extending between the first end and the first side.

16 Claims, 9 Drawing Sheets

U.S. PATENT DOCUMENTS

| | | |
|---|---|---|
| 2006/0043542 A1 | 3/2006 | Corisis |
| 2006/0131706 A1 | 6/2006 | Corisis |
| 2006/0186530 A1 | 8/2006 | Roohparvar |
| 2006/0216866 A1 | 9/2006 | Lam et al. |
| 2006/0220191 A1 | 10/2006 | Sundstrom |
| 2006/0228832 A1 | 10/2006 | Koh |
| 2006/0281228 A1 | 12/2006 | Li et al. |
| 2007/0001272 A1* | 1/2007 | Lee et al. ............ 257/666 |
| 2007/0057361 A1 | 3/2007 | Lange et al. |
| 2007/0102794 A1 | 5/2007 | Hsiao et al. |
| 2007/0164411 A1 | 7/2007 | Huang et al. |
| 2008/0012099 A1 | 1/2008 | Yeh et al. |
| 2008/0012110 A1 | 1/2008 | Chong et al. |
| 2008/0017994 A1 | 1/2008 | Do et al. |
| 2008/0036052 A1 | 2/2008 | Do et al. |
| 2008/0038872 A1 | 2/2008 | Kimura |

FOREIGN PATENT DOCUMENTS

| | | |
|---|---|---|
| KR | 20030078213 A | 10/2003 |
| KR | 20050017838 A | 2/2005 |
| WO | 2006052382 A | 5/2006 |

OTHER PUBLICATIONS

Kim, J. et al., "Multi-Flip Chip on Lead Frame Overmolded IC Package: A Novel Packaging Design to Achieve High Performance and Cost Effective Module Package," IEEE 2005 Electronic Components and Technology Conference, May 31-Jun. 3, 2005, pp. 1819-1821.

Kuehnlein, G., "Recent Progress in Popcorn Performance and Cost Reduction of QFP160 using Ni/Pd plated Dambar Less Lead Frames," Proceedings of the 2nd Electronics Packaging Technology Conference, pp. 325-330, Dec. 8-10, 1998.

Mahulikar, D., "Trends in Lead Frame Technology for Plastic Packaging," Proceedings of the 3rd International Symposium on Advanced Packaging Materials, pp. 94-97, Mar. 9-12, 1997.

Rodriguez de Miranda, W.R. et al., "Lead Forming and Outer Lead Bond Pattern Design for Tape-Bonded Hybrids," IEEE Transactions on Components, Hybrids, and Manufacturing Technology, vol. CHMT-1, No. 4, pp. 377-382, Dec. 1978.

* cited by examiner

PACKAGED MICROELECTRONIC DEVICES AND METHODS FOR MANUFACTURING PACKAGED MICROELECTRONIC DEVICES

CROSS-REFERENCE TO RELATED APPLICATION

This application is a divisional of U.S. patent application Ser. No. 12/183,981 filed Jul. 31, 2008, which is incorporated herein by reference.

TECHNICAL FIELD

The present disclosure is related to packaged microelectronic devices and methods for manufacturing packaged microelectronic devices.

BACKGROUND

Packaged microelectronic assemblies, such as memory devices and microprocessors, typically include a microelectronic die mounted to a substrate and encased in a plastic protective covering. The die includes functional features, such as memory cells, processor circuits, and interconnecting circuitry. The die also typically includes bond pads electrically coupled to the functional features. The bond pads are electrically connected to pins or other types of terminals that extend outside the protective covering for connecting the die to busses, circuits, or other microelectronic assemblies. In one conventional arrangement, the die is mounted face up or face down to a support structure, such as a leadframe or a printed circuit board, and the die bond pads are electrically coupled to corresponding bond pads of the support structure with wire bonds or metal bumps (e.g., solder balls or other suitable connections). After encapsulation, additional metal wire bonds or bumps can electrically couple the support member to one or more external devices. Accordingly, the support structure supports the die and provides an electrical link between the die and the external devices.

Die manufacturers have come under increasing pressure to reduce the volume occupied by the dies and yet increase the capacity of the resulting encapsulated assemblies. To meet these demands, die manufacturers often stack multiple dies on top of each other to increase the capacity or performance of the device within the limited surface area on the circuit board or other element to which the dies are mounted.

DETAILED DESCRIPTION

Specific details of several embodiments of the disclosure are described below with reference to packaged microelectronic devices and methods for manufacturing such devices. The microelectronic devices described below include four microelectronic dies stacked in an offset configuration and coupled to each other and to a support member. In other embodiments, the microelectronic devices can have more or less than four microelectronic dies, which may be stacked in an offset, aligned, or combination of the two configurations. The microelectronic devices can include, for example, micromechanical components, data storage elements, optics, read/write components, or other features. The microelectronic dies can be flash memory (e.g., NAND flash memory), SRAM, DRAM (e.g., DDR-SDRAM), processors, imagers, and other types of devices. The term "coupled" may encompass various types of relationships between two or more components or features. Further, the phrase "electrically coupled" may encompass a path conductively linking two or more components or features, or the phrase "mechanically coupled" may encompass a physical association or structural linking of two or more components or features. Moreover, several other embodiments of the disclosure can have configurations, components, features or procedures different than those described in this section. A person of ordinary skill in the art, therefore, will accordingly understand that the disclosure may have other embodiments with additional elements, or the disclosure may have other embodiments without several of the elements shown and described below with reference to FIGS. 2-5.

Figure 1:
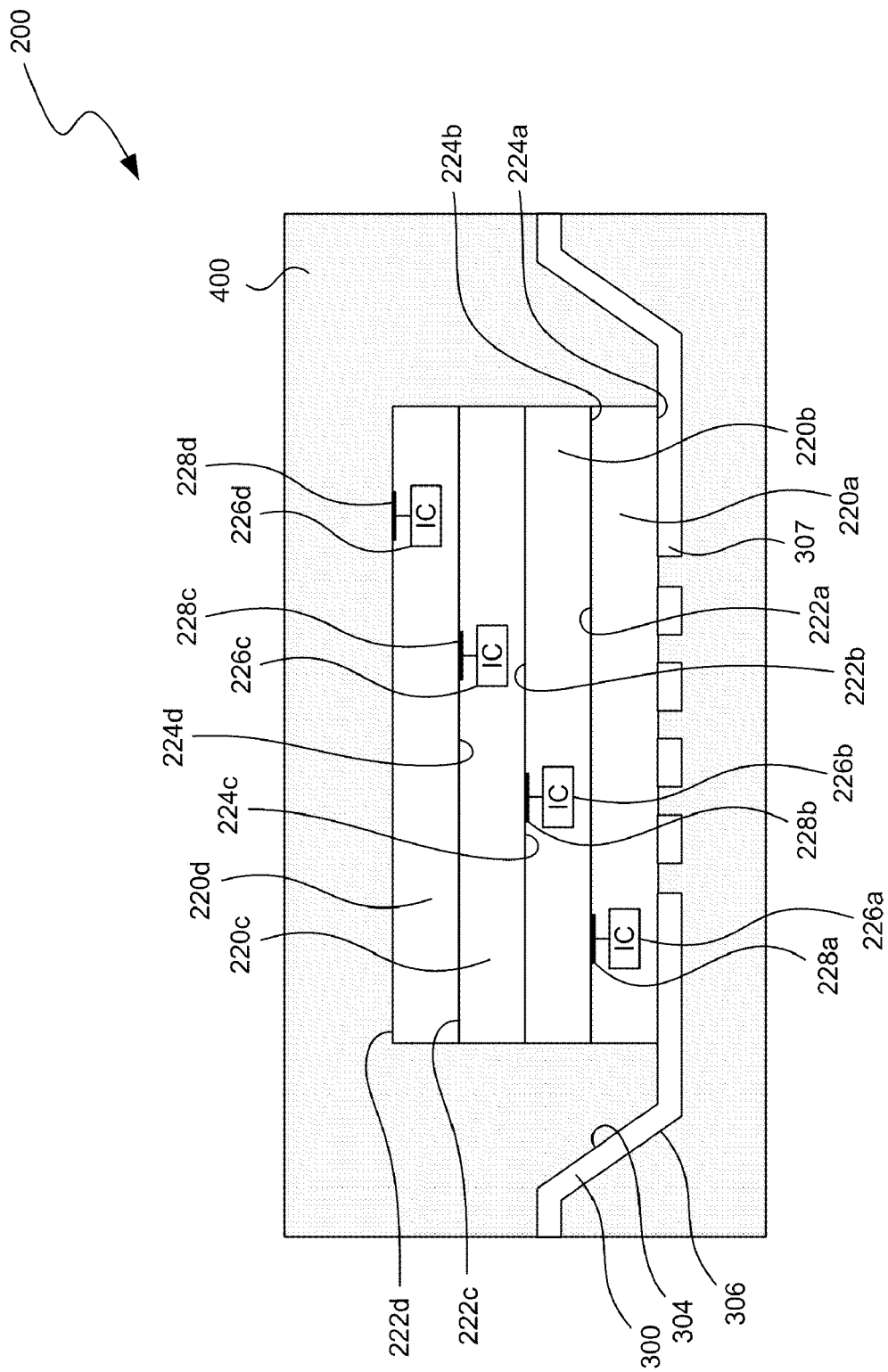
FIG. 1 is a schematic, end cross-sectional view of a packaged microelectronic device configured in accordance with an embodiment of the disclosure.

FIG. 1 is a schematic, end cross-sectional view of a microelectronic device 200 in accordance with an embodiment of the disclosure. In this embodiment, the device 200 includes a plurality of stacked microelectronic dies 220 shown individually as first-fourth dies 220a-d, respectively. The first microelectronic die 220a is coupled to a support structure 300, and the second-fourth microelectronic dies 220b-d are stacked on the first microelectronic die 220a. As viewed in FIG. 1, certain sides of the four microelectronic dies 220a-d can be stacked in an aligned configuration such that the sides are flush with one another. As described in more detail below, however, the ends of the dies can be laterally offset from each other to form a staggered or stepped stack of dies. The first microelectronic die 220a may be mechanically coupled to the support member 300 by an adhesive material (not shown) such as an adhesive film, epoxy, tape, paste, or other suitable material, and the second-fourth dies 220b-d may be similarly adhered to adjacent dies. In other embodiments, the device 200 can have more or fewer dies (e.g., one or more dies 220).

The device 200 can also include an encapsulant, shell, or cap 400 formed, molded or otherwise deposited over the microelectronic dies 220 and at least a portion of the support structure 300. The encapsulant 400 enhances the integrity of the device 200 and protects the microelectronic dies 220 and the mechanical and electrical connections between the dies and the support member 300 from moisture, chemicals, and other contaminants.

The first microelectronic die 220a can be a semiconductor die or other type of microelectronic die. The first die 220a, for example, can be a processor, a memory device (e.g., a DRAM or NAND flash memory device), a sensor, a filter, or other type of microelectronic device. The first die 220a includes an active or front side 222a and a back side 224a opposite the active side 222a. The active or front side 222a generally refers to the side of the first die 220a that is accessed during formation of the active elements of the first die 220a. The first die 220a also includes integrated circuitry 226a (shown schematically) and a plurality of terminals 228a (only one is illustrated in FIG. 1) arranged in an array at the active side 222a and electrically coupled to the integrated circuitry 226a. The terminals 228a are typically bond-pads that provide external contacts to provide source voltages, ground voltages, and signals to the integrated circuitry 226a of the first die 220a. The second-fourth dies 220b-d can be the same type of die as the first die 220a, or one or more of the dies can be different types of dies. The second-fourth dies can similarly have active sides 222b-d, backsides 224b-d, integrated circuitry 226b-d, and terminals 228b-d, respectively. Therefore, according to various embodiments of the disclosure, the first die 220a and/or the second die 220b and/or the third die 220c and/or the fourth die 220d can have the same or different features to perform similar or distinct functions.

The support structure 300 may include a leadframe having a first side 304 and a second side 306 opposite the first side 304. A plurality of bond pads (not shown in FIG. 1) may be disposed on at least one of the first and second sides 304 and 306 to electrically couple the support structure 300 with the microelectronic dies 220. The support structure 300 may include a portion conventionally referred to as a "die paddle" 307 to which the first microelectronic die 220 may be mechanically attached. The die paddle 307 may be located at a central portion of the support structure 300. In the case of an off center parting line (OCPL) package, the die paddle 307 may be downset relative to a peripheral portion of the support structure 300. The term "downset" can encompass pushing the die paddle down relative to the leads so as to comply with standardized requirements for the location of the leads relative to the overall package of a microelectronic device.

Figure 2:
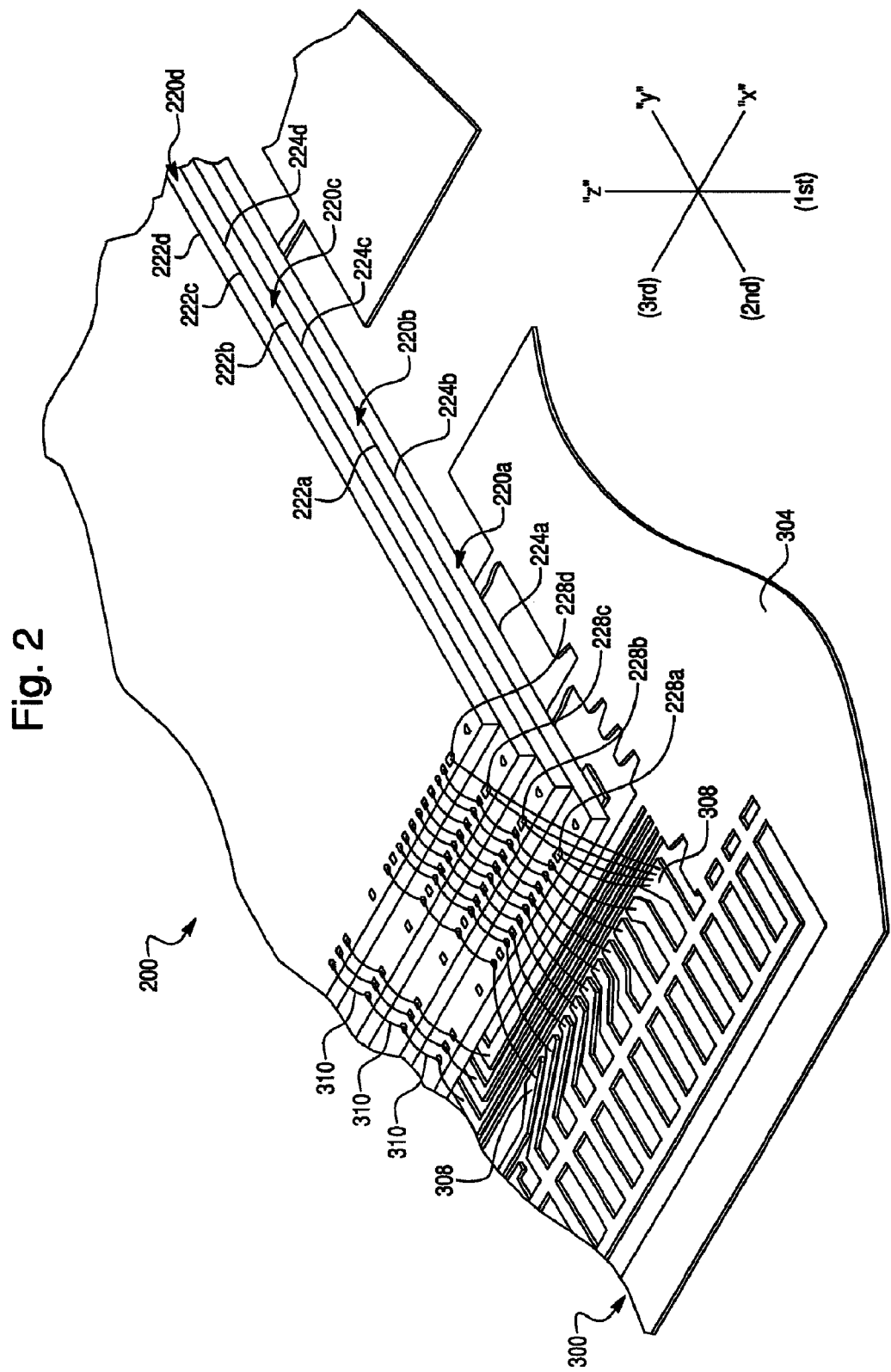
FIG. 2 is a schematic, perspective view at an intermediate stage of manufacturing a packaged microelectronic device configured in accordance with an embodiment of the disclosure.

FIG. 2 is a perspective view of an embodiment of the device 200 in which the microelectronic dies 220a-d are offset in a staggered or stepped configuration to facilitate access to the electrical terminals 228a-d for electrically coupling the four microelectronic dies 220a-d to one another and/or to the support structure 300. The microelectronic dies 220a-d can be stacked vertically along a first axis Z so that the sides of the dies 220a-d are at least generally aligned (i.e., flush) with respect to a second axis X. Additionally, the second-fourth dies 220b-d are offset with respect to a third axis Y by a distance sufficient to expose the array of electrical terminals 228a-c on the immediately adjacent underlying die 220a-c. This is particularly useful for dies that have bond-pad arrays at one end of the die, such as many flash memory devices. The lateral offset along the third axis Y enables a wirebonding machine to attach wirebonds to the terminals 228a-d to electrically couple the microelectronic dies 220a-d to each other and to a plurality of bond pads 308 on the support structure 300. A plurality of wire bonds 310 or other types of electrical connectors can accordingly extend between the electrical terminals 228a-d and the bond pads 308.

Figure 3:
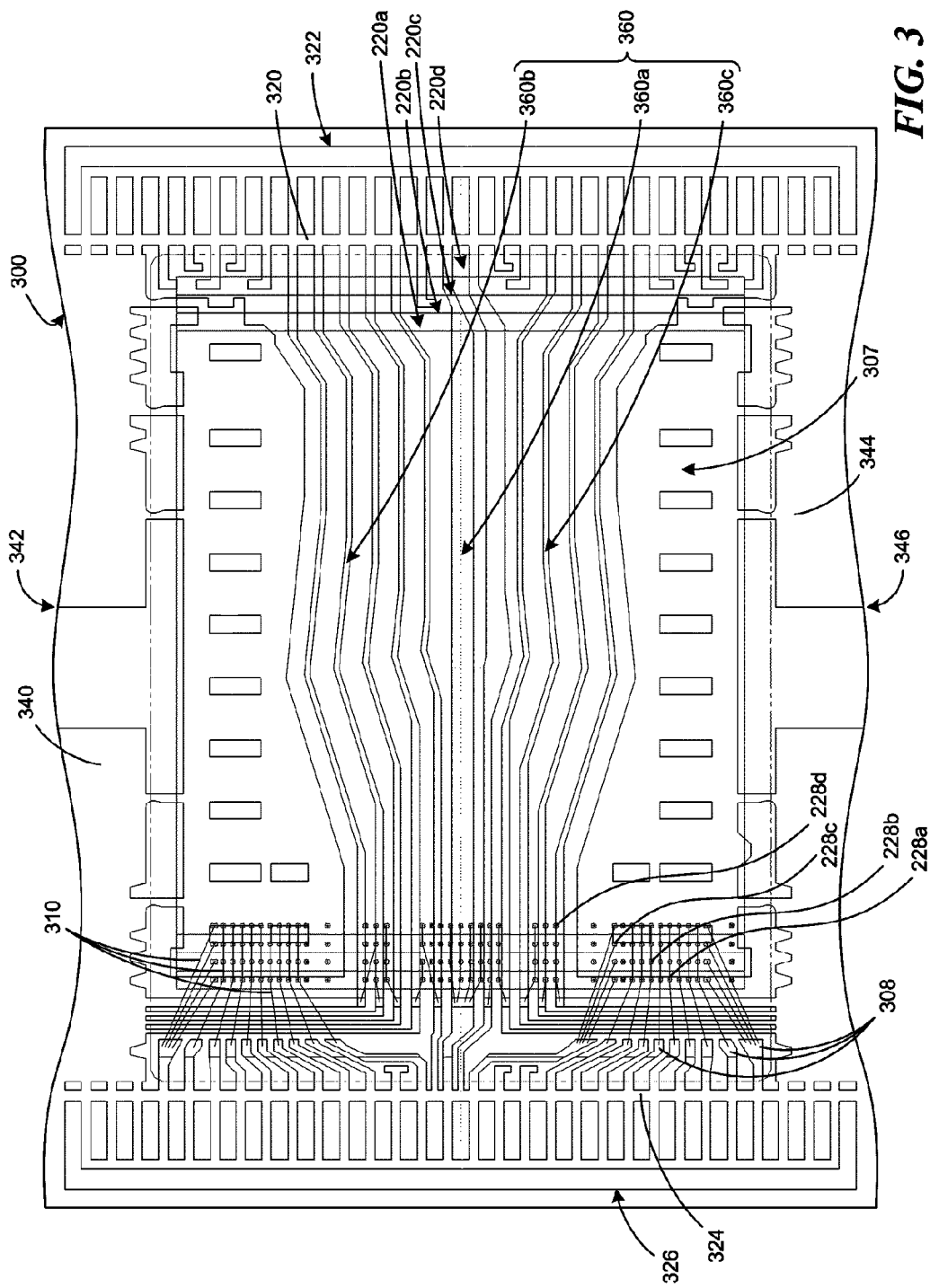
FIG. 3 is a schematic, plan view of a support member at an intermediate stage of manufacturing a packaged microelectronic device configured in accordance with an embodiment of the disclosure.
Figure 4:
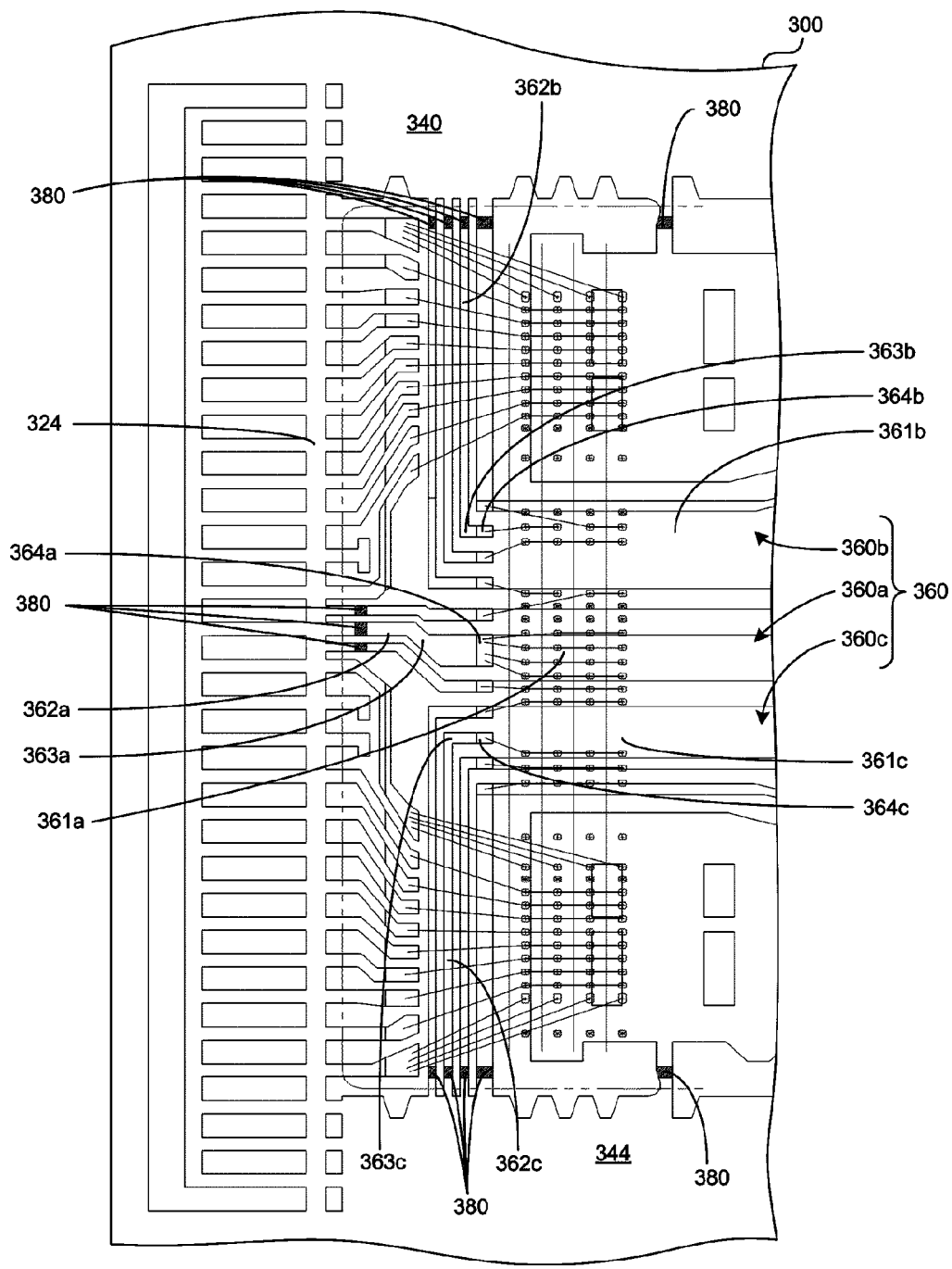
FIG. 4 is a detail view of the support member shown in FIG. 3.

FIGS. 3 and 4 show an intermediate stage of manufacturing the microelectronic device 200. Specifically, FIGS. 3 and 4 show the support structure 300, which may be only one of a plurality of similar structures that are in various stages of concomitant manufacture, prior to being encapsulated with the encapsulant 400 and prior to deflashing, trimming, lead forming or singulation. Deflashing typically involves removing the excess plastic material sticking out of the package edges right after encapsulation, and trimming includes cutting to remove electrical shorts that couple leads together. In the case of lead frames, lead forming involves forming the portions of the leads that project externally from the encapsulant 400 into the desired shape and position. Singulation includes separating individual devices from the support structure. An alternating long and double short line in FIGS. 3 and 4 indicates the location for trimming and for singulation, which may occur individually or in a combined operation.

In the example shown in FIG. 3, the support structure 300 is a leadframe that extends longitudinally from a first dambar 320 at a first end 322 of the support structure 300 to a second dambar 324 at a second end 326 of the support structure 300. Similarly, the support structure 300 extends latitudinally from a first tie-bar 340 at a first side 342 of the support structure 300 to a second tie-bar 344 at a second side 346 of the support structure 300. The term "dambar" may encompass the features that block or dam a flow of the encapsulant 400 to the external lead areas of the support structure 300. As shown in FIG. 3, the first and second dambars 320 and 324 electrically short leads together and must be trimmed before the microelectronic device 200 can be operated. The term "tie-bar" may encompass features of the die paddle 307 that locate the first die 220a with respect to the first and second sides 342 and 346 of the support structure 300. FIG. 3 also schematically shows the plurality of wire bonds 310 electrically coupling the plurality of bond pads 308 on the support structure 300 with the bonding pads 228a-d on the microelectronic dies 220a-d. Outlines of the four dies 220a-d are indicated with phantom lines in FIG. 3 for the sake of illustration clarity. After encapsulation, the first and second tie-bars 340 and 344 are cut to singulate individual microelectronic devices 200.

The support structure 300 further includes a plurality of elongated leads 360 that extend longitudinally across the length of the support structure 300. The long leads accommodate the terminals 228 located at only one end of the dies 220. The terms "longitudinally" and "latitudinally" are defined with respect to the general orientation of the plurality of elongated leads 360 (identified individually by reference numbers 360a-c) that extend across the die paddle 307 of the support structure 300. The leads 360 generally extend longitudinally from the first dambar 320 and span more than half the distance between the first and second ends 322 and 326. In accordance with the embodiment of the disclosure shown in FIG. 3, the length of individual ones of the leads 360 may be approximately equal to or greater than the distance between the first and second ends 322 and 326. As shown in the embodiment according to FIG. 3, the leads 360 can extend like a dambar to the first or second tie-bars 340 and 344, and can extend like a tie-bar to the first and second dambars 320 and 324.

Referring to FIG. 4, each of the leads 360 may include specific features depending on the lead routing and electrical coupling. The first lead 360a includes a first section 361a connected to the first dambar 320 and a second section 362a connected to the second dambar 324. The first and second sections 361a and 362a of the first lead 360a may be collinear or parallel, in which case a transition section 363a coupling the first and second sections 361a and 362a may be relatively angularly oriented thereto (e.g., oblique or perpendicular with respect to the first and second sections 361a and 362a). The first lead 360a also includes one or more bond pads 364a. Although the bond pad 364a of the first lead 360a shown in FIG. 4 is disposed on the first section 361a, it can additionally or alternatively be disposed on the second section 362a and/or the transition section 363a. Accordingly, more area of the first lead 360a can be available for direct die to leadframe metal bonding. The bond pad 364a may be prepared, e.g., silver-plated, prior to being electrically coupled with one or more of the plurality of wire bonds 310.

The second lead 360b includes a first section 361b that extends from the first dambar 320, and includes a second section 362b that extends from the first tie-bar 340. The first section 361b may be angularly related to the second section 362b, e.g., perpendicular to one another. A transition section 363b couples the first and second sections 361b and 362b. The second lead 360b also includes a bond pad 364b. Although the bond pad 364b of the second lead 360b is shown in FIG. 4 disposed on the first section 361b, it can additionally or alternatively be disposed on the second section 362b and/or on the transition section 363b. Accordingly, more area of the second lead 360b can be available for direct die to leadframe metal bonding. The bond pad 364b may be prepared, e.g., silver-plated, prior to being electrically coupled with one or more of the plurality of wire bonds 310.

Similarly, the third lead 360c includes a first section 361c that extends from the first dambar 320, and includes a second section 362c that extends from the second tie-bar 344. The first section 361c may be angularly related to the second section 362c, e.g., perpendicular to one another. A transition section 363c couples the first and second sections 361c and 362c. The third lead 360c also includes a bond pad 364c. Although the bond pad 364c of the third lead 360c is shown in FIG. 4 disposed on the first section 361c, it can additionally or alternatively be disposed on the second section 362c and/or on the transition section 363c. Accordingly, more area of the third lead 360c can be available for direct die to leadframe metal bonding. The bond pad 364c may be prepared, e.g., silver-plated, prior to being electrically coupled with one or more of the plurality of wire bonds 310.

There can be more than one of each of the first, second and third leads 360a-360c. In accordance with an embodiment of the disclosure as shown in FIG. 4, there can be three of the first leads 360a that extend between the first and second dambars 320 and 324, there can be four of the second leads 360b that extend between the first dambar 320 and the first tie-bar 340, and there can be four of the third leads 360c that extend between the first dambar 320 and the second tie-bar 344. The support structure 300 according to FIG. 4 is well suited to a multiple die NAND flash memory device. Of course, the relative numbers of the different leads 360a-360c may vary as appropriate for other microelectronic devices. Moreover, at least one of the different leads 360a-360c may be omitted, e.g., in lieu of having at least one of each of the first, second and third leads 360a-360c, a support structure 300 may include only examples of the second and third leads 360b and 360c.

FIG. 4 also illustrates downsetting on a support structure 300 according to an embodiment of the disclosure. As shown in FIG. 4, the displacement due to downsetting occurs in areas 380 of each of the first, second and third leads 360a-360c that are proximate to the dambars and tie-bars. Displacement due to downsetting also occurs elsewhere at additional locations around the support structure 300.

Long lead spans in conventional support structures generally necessitate the use of lead-locking tape (e.g., R-970 manufactured by Tomoegawa Co., Ltd.) to avoid lead floating or instability due to flexing of the lead that could impact the relative spatial relationships of the leads. Long leads tend to float (i.e., move latitudinally), and this is particularly problematic in conventional support structures for single-side die bonding with downsetting (e.g., NAND flash memory dies). Maintaining the correct spatial relationship improves lead planarity and thereby avoids poor wire-bonding yields; however, using lead-locking tape adds to the cost and complexity of manufacturing a microelectronic device and increases the thickness of the package stack-up. If the stack-up becomes too great, additional die back-grinding may be necessary to compensate for the thickness of the lead-locking tape.

In accordance with an embodiment of the disclosure, the leads 360 are routed so as to extend from a dambar across more than half the longitudinal distance of the support structure either to connect to the opposite dambar or to connect near the oppose dambar to one of the tie-bars. As shown in FIG. 4, an example of a first lead 360a extends from the first dambar (not shown in FIG. 4) to the second dambar 324, an example of a second lead 360b extends from the first dambar (not shown in FIG. 4) to the first tie-bar 340, and an example of a third lead 360c extends from the first dambar (not shown in FIG. 4) to the second tie-bar 344. Thus, according to embodiments of the disclosure, the spatial relationships of the first, second and third leads 360a-360c are maintained, without using lead-locking tape, by virtue of the leads being fixed at both ends to the first and second dambars 320 and 324 and/or the first and second tie-bars 340 and 344. Further, according to embodiments of the disclosure, the spatial relationship is maintained during package manufacturing stages including downsetting, die attaching, wire-bonding, encapsulation, deflashing, trimming, lead forming, and singulation. According to embodiments of the disclosure, at least one of the leads 360 can be used as an effective ground for enhancing electrical performance.

Figure 5A:
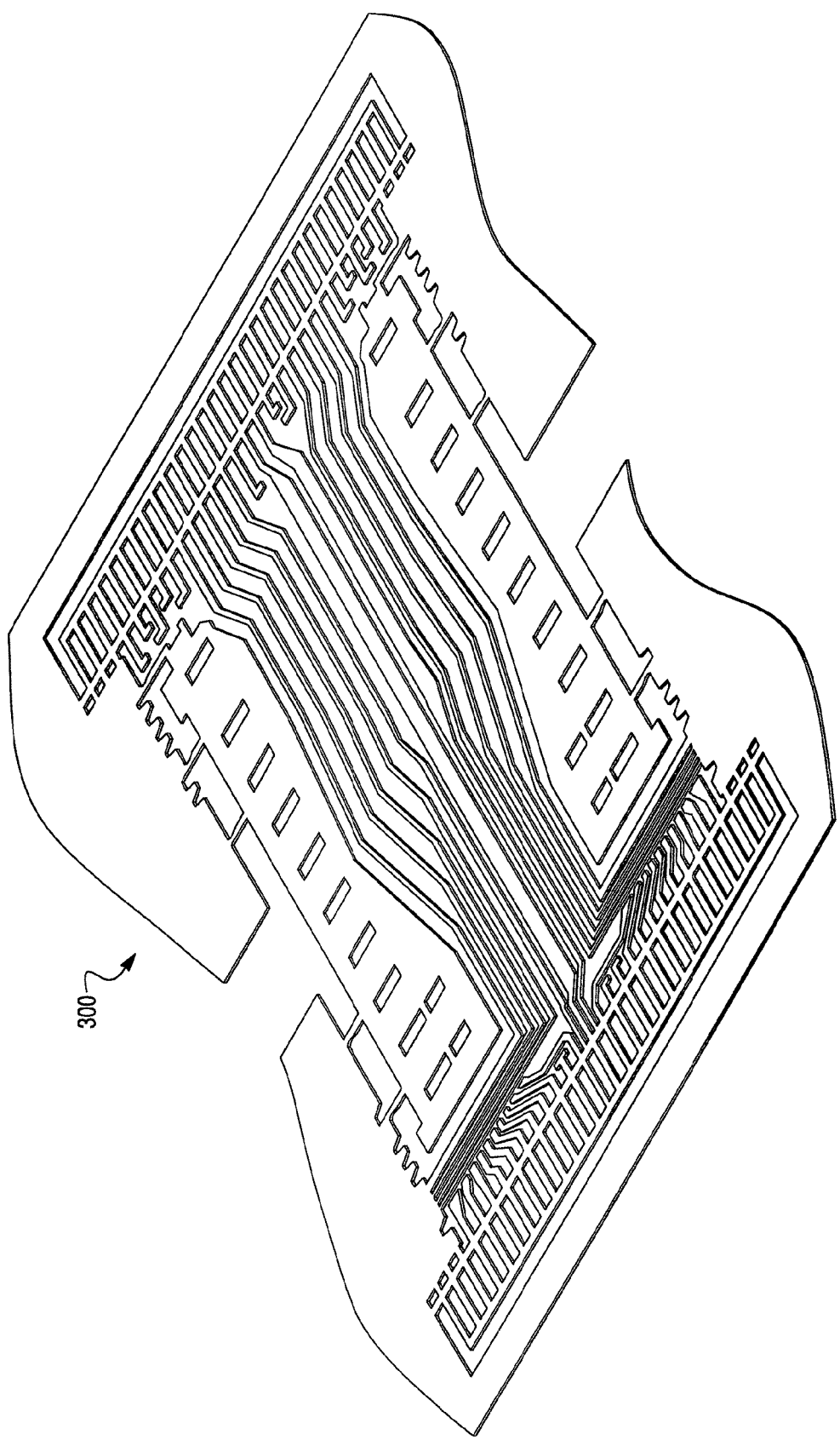
FIGS. 5A-5D schematically illustrate various stages of a method of manufacturing a packaged microelectronic device configured in accordance with an embodiment of the disclosure.

FIGS. 5A-5D show certain stages of a method of manufacturing a microelectronic device 200, including a support structure 300, in accordance with an embodiment of the disclosure. The support structure 300 provides mechanical support to a die during assembly of the microelectronic device 200. Referring to FIG. 5A, the support structure 300 may be made of a metal alloy, e.g., Alloy 42, that provides good adherence to the encapsulant 400, a coefficient of thermal expansion as close as possible to those of the die and the encapsulant 400, high strength, good formability, and high electrical and thermal conductivities. The features of the support structure 300 may be formed by stamping, etching, or another process. The term "stamping" can encompass a mechanical process that uses one or more stamping/punching steps to form the features of the support structure 300. The term "etching" can encompass selectively covering a metal sheet with a photoresist in accordance with a desired pattern, and exposing the metal sheet to a chemical etchant that removes areas not covered by photoresist. Additional processing of the support structure 300 may include silver-plating the bond pads and downsetting.

Figure 5B:
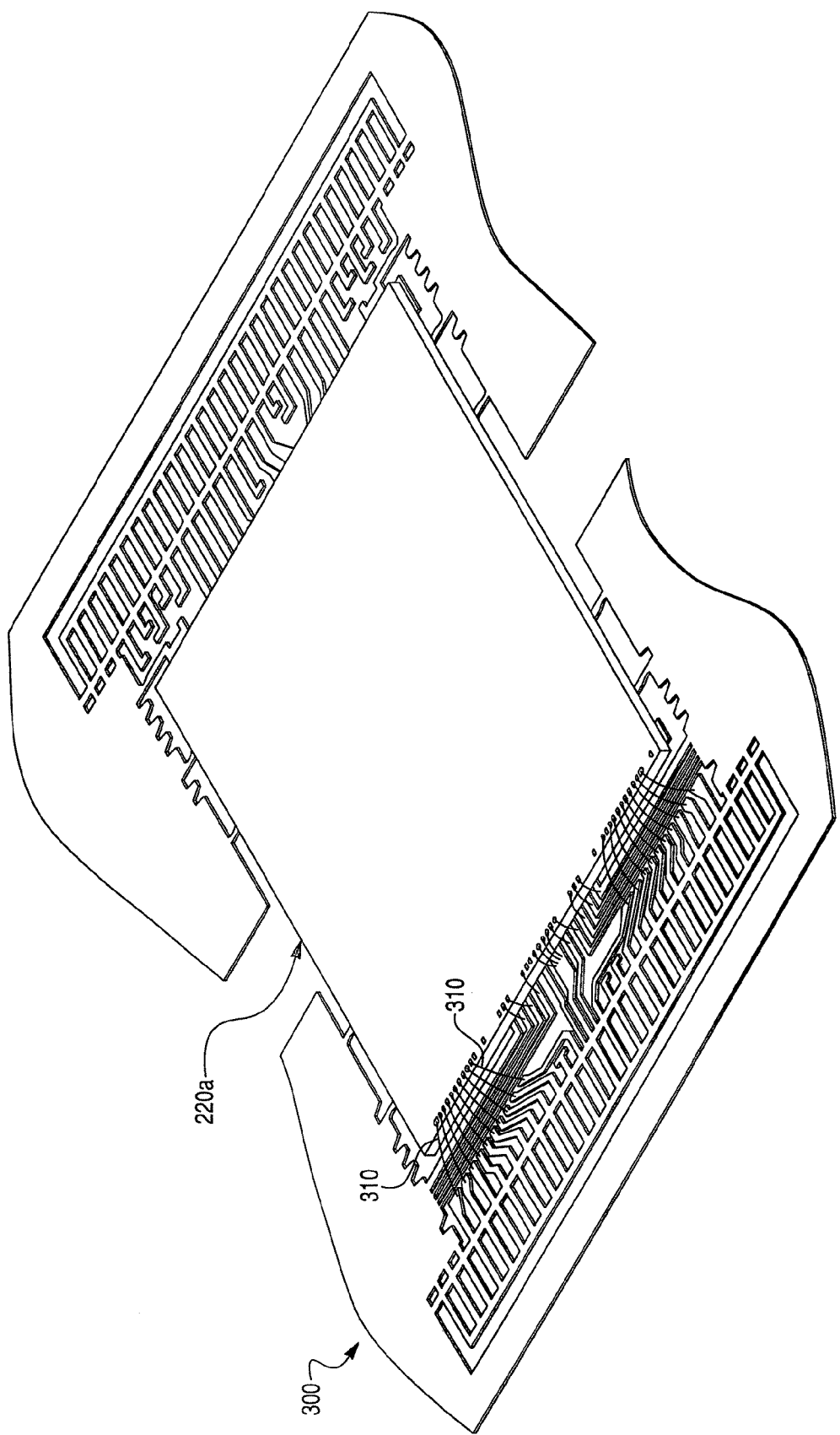

Referring to FIG. 5B, the first microelectronic die 220a is mechanically coupled, e.g., with an adhesive, to the die paddle of the support structure 300 and is electrically coupled to the leads 360, e.g., by wire bonding 310 or by tape automated bonds. Although not shown in FIG. 5B, the second, third and fourth microelectronic dies 220b-220d are sequentially stacked on the first die 220a and similarly coupled.

Figure 5C:
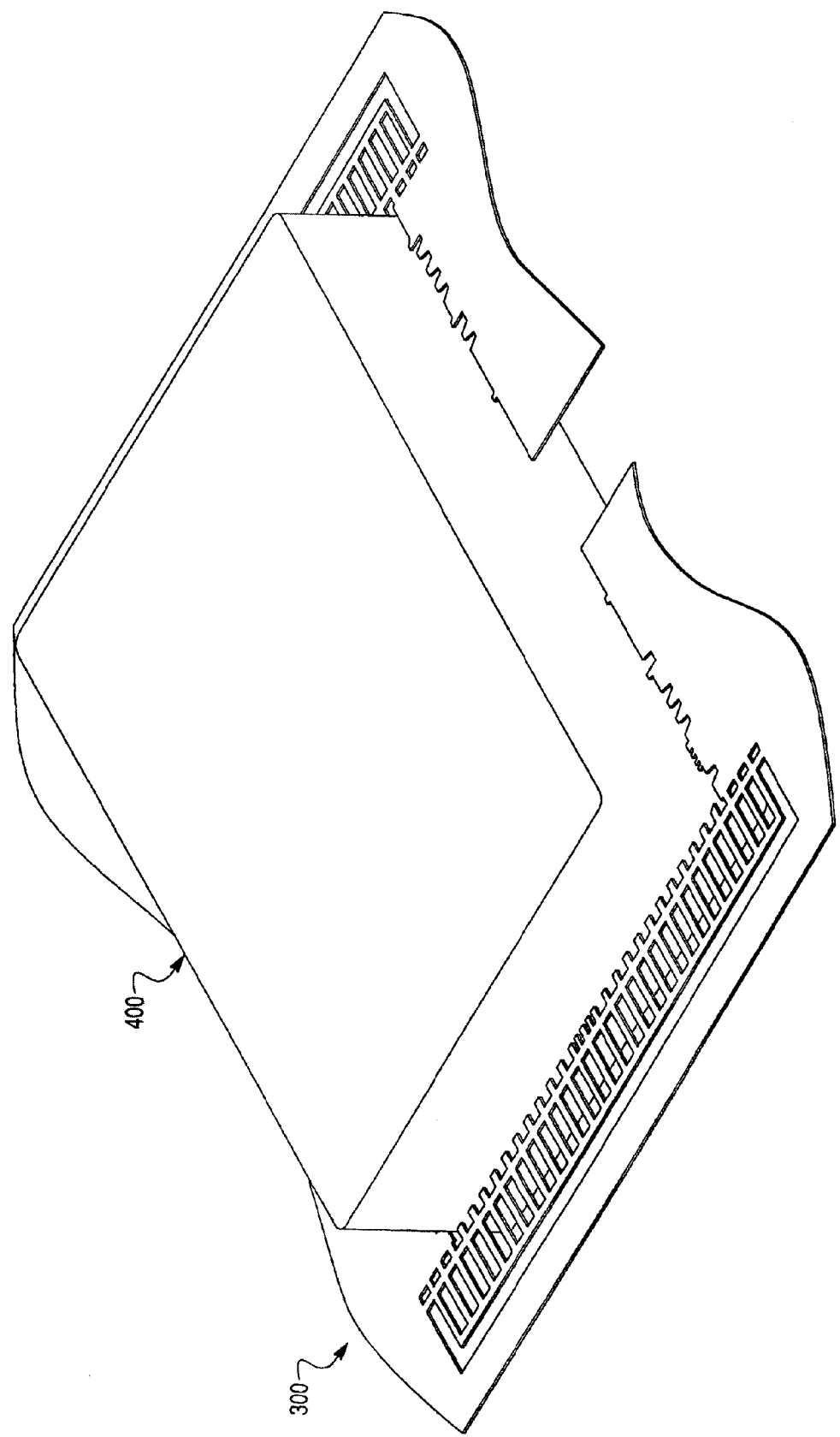

FIG. 5C shows the encapsulant 400 molded over the support structure 300 as well as the four microelectronic dies 220a-d. According to embodiments of the present disclosure, lead float of the second and third leads 360b and 360c is avoided and the spatial relationships of the second and third leads 360b and 360c are maintained because the second sections 362b and 362c remain connected to the first and second tie-bars 340 and 344 while molding the encapsulant 400. Subsequent molding with the encapsulant 400 fixes the spatial relationships of the leads 360 in the encapsulated volume. Excess encapsulant 400 may be removed by deflashing as is conventionally known.

Figure 5D:
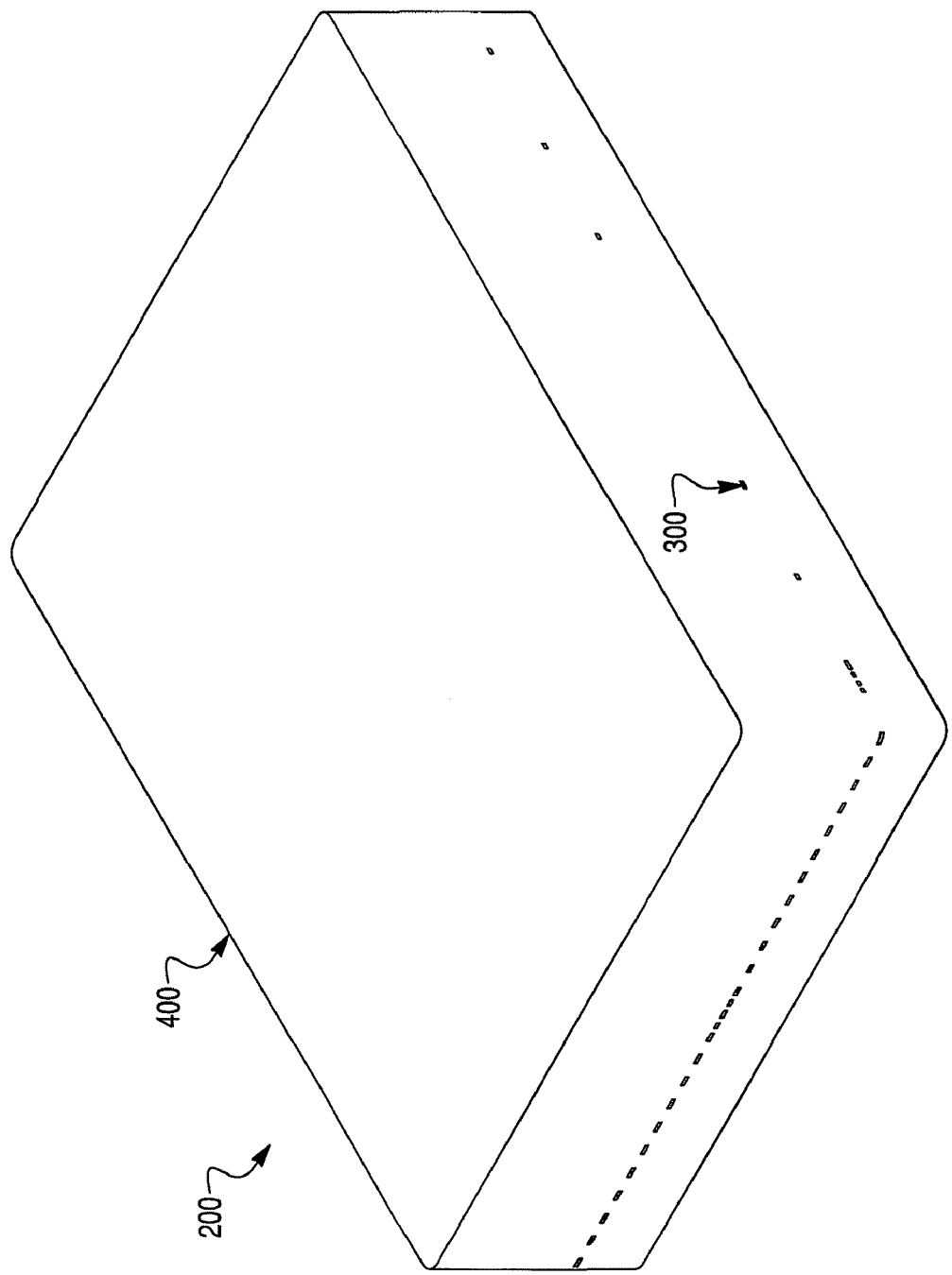

FIG. 5D shows the microelectronic device 200 after trimming and forming the leads. In accordance with embodiments of the present disclosure, trimming may include cutting and removing the first and second dambars 320 and 324 as well as the first and second tie-bars 340 and 344. Trimming both the dambars and the tie-bars may occur concurrently or in separate operations. Trimming the first and second tie-bars 340 and 344 severs the couplings that electrically short each of the second and third leads 360b and 360c. Lead forming may also occur at the same time that the first and second dambars 320 and 324 are trimmed. Lead forming may include preparing, e.g., shaping, that portion of the leads 360 that project outside the encapsulant 400 for subsequently coupling the microelectronic device 200 to a printed circuit board or to another device.

In contrast to conventional support structures, several embodiments of support structures in accordance with the disclosure do not require additional manufacturing stages to separately cut lead tips nor require the use of lead-locking tape. Conventional support structures may include an additional formation that couples together the tips of a plurality of leads. Insofar as this additional formation electrically shorts the leads, the additional formation must be cut from the conventional support structure in order to electrically isolate the leads. Moreover, because this additional formation is disposed at an interior position, i.e., as opposed to being located at the periphery of the conventional support structure, a separate, additional manufacturing stage is required to cut the lead tips prior to encapsulation. Cutting the lead tips exasperates lead float and the need for using lead-locking tape in the conventional support structure. The lead-locking tape used in conventional support structures adds another component, adds another manufacturing stage to implement use of the lead-locking tape, and increases the package stack-up thickness. To offset an increase in the package stack-up thickness due to the lead-locking tape, conventional support structures sometimes require yet another manufacturing stage to backgrind the dies. Several embodiments of devices in accordance with the disclosure, however, are directly ready for attaching the first microelectronic die 220 to the support structure 300 without the additional manufacturing stages of convention support members.

Figure 6:
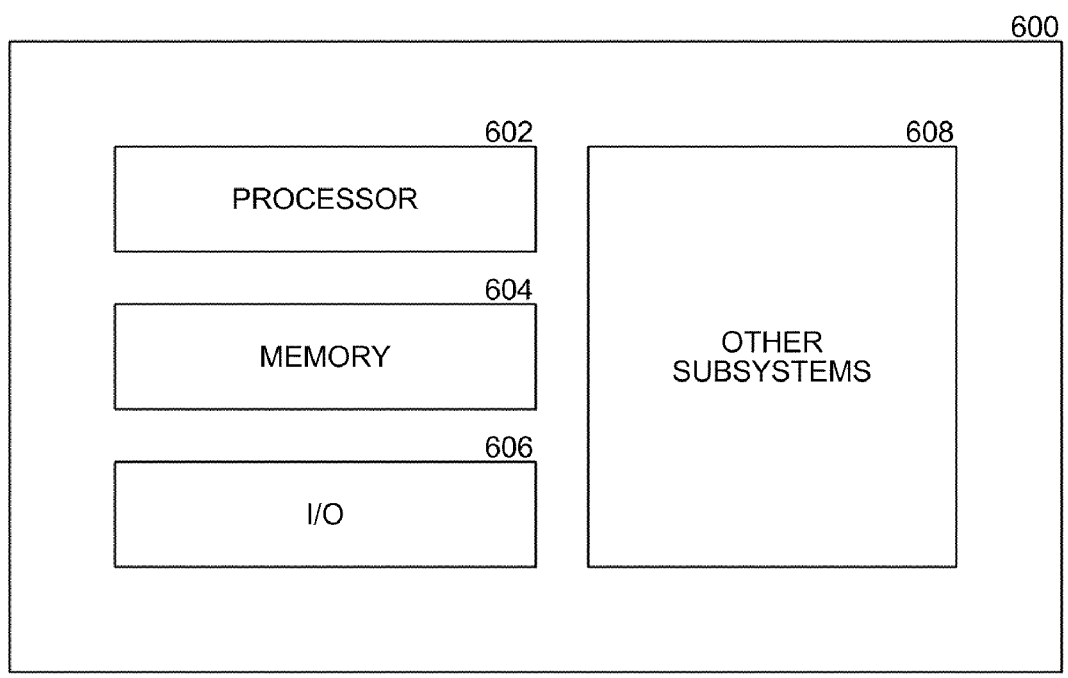
FIG. 6 is a schematic illustration of a system that can include one or more microelectronic devices configured in accordance with embodiments of the disclosure.

The microelectronic device 200 or any one of the microelectronic devices formed using the methods described above with reference to FIGS. 1-5D can be incorporated into any of a myriad of larger and/or more complex systems 600, a representative one of which is shown schematically in FIG. 6. The system 600 can include a processor 602, a memory 604 (e.g., SRAM, DRAM, DDR-SDRAM, flash memory, such as NAND flash memory or other types of flash memory, and/or other suitable memory devices), input/output devices 606, and/or other subsystems or components 608. Microelectronic devices and/or microfeature workpieces (e.g., in the form of microfeature dies and/or combinations of microfeature dies) may be included in any of the components shown in FIG. 6. The resulting system 600 can perform any of a wide variety of computing, processing, storage, sensor, imagers, and/or other functions. Accordingly, representative systems 600 include, without limitation, computers and/or other data processors, for example, desktop computers, laptop computers, Internet appliances, hand-held devices (e.g., palm-top computers, wearable computers, cellular or mobile phones, personal digital assistants), multi-processor systems, processor-based or programmable consumer electronics, network computers, and mini-computers. Other representative systems 600 include cameras, light or other radiation sensors, servers and associated server subsystems, display devices, and/or memory devices. In such systems, individual dies can include imager arrays, such as a CMOS imager. Components of the system 600 may be housed in a single unit or distributed over multiple, interconnected units, e.g., through a communications network. Components can accordingly include local and/or remote memory storage devices and any of a wide variety of computer-readable media.

From the foregoing, it will be appreciated that specific embodiments of the disclosure have been described herein for purposes of illustration, but that various modifications may be made without deviating from the spirit and scope of the disclosure. For example, structures and/or processes described in the context of particular embodiments may be combined or eliminated in other embodiments. In particular, the attachment features described above with reference to particular embodiments can include one or more additional features or components, or one or more of the features described above can be omitted. Further, the connections between the attachment feature, the interconnects, and other devices (e.g., bond pads, conductive couplers, and/or external devices) can have arrangements different than those described above. Moreover, while advantages associated with certain embodiments of the disclosure have been described in the context of these embodiments, other embodiments may also exhibit such advantages, and not all embodiments need necessarily exhibit such advantages to fall within the scope of the disclosure. Accordingly, embodiments of the disclosure are not limited except as by the appended claims.

We claim:

1. A method of manufacturing a microelectronic device, comprising:
   forming a plurality of first leads of a leadframe that extends longitudinally between first and second ends and latitudinally between first and second sides, forming individual first leads including
      forming a first section extending generally longitudinally from the first end of the leadframe;
      forming a second section extending laterally between the first side and the first section; and
      preparing a first bond pad proximate to the second end of the leadframe;
   mechanically coupling a first die to the leadframe, the first die being disposed longitudinally between the bond pad and the first end of the leadframe and being oriented with a first electrical terminal proximate to the second end; and
   electrically coupling the first electrical terminal and an individual first bond pad.

2. The method of claim 1, further comprising encapsulating the first die, the first bond pad, and the first electrical terminal.

3. The method of claim 2, wherein encapsulating comprises molding an encapsulant between the first lead and an adjacent lead.

4. The method of claim 1, further comprising:
   forming a second lead of the leadframe, the forming the second lead including forming a first section extending generally longitudinally from the first end of the leadframe, forming a second section extending laterally between the second side and the first section, and preparing a second bond pad proximate to the second end of the leadframe.

5. A method of manufacturing a microelectronic device, comprising
   forming a first lead of a leadframe that extends longitudinally between first and second ends and latitudinally between first and second sides, the forming the first lead including forming a first section extending generally longitudinally from the first end of the leadframe, forming a second section extending laterally between the first side and the first section, and preparing a first bond pad proximate to the second end of the leadframe;

mechanically coupling a first die to the leadframe, the first die being disposed longitudinally between the bond pad and the first end of the leadframe and being oriented with a first electrical terminal proximate to the second end;

electrically coupling the first electrical terminal and the first bond pad;

forming a second lead of the leadframe, the forming the second lead including forming a first section extending generally longitudinally from the first end of the leadframe, forming a second section extending laterally between the second side and the first section, and preparing a second bond pad proximate to the second end of the leadframe; and forming a third lead of the leadframe, the forming the third lead including forming a first section extending generally longitudinally from the first end of the leadframe, forming a second section extending generally longitudinally between the second end and the first section, and preparing a third bond pad proximate to the second end of the leadframe.

6. The method of claim 1, further comprising:

mechanically coupling a second die to the first die, the second die being disposed longitudinally between the first electrical terminal of the first die and the first end of the leadframe and being oriented with a second electrical terminal proximate to the second end of the leadframe.

7. The method of claim 6, further comprising:

electrically coupling the second electrical terminal and individual first bond pad.

8. The method of claim 1, further comprising:

forming a plurality of second leads of the leadframe, wherein forming individual second leads includes
forming a first section extending generally longitudinally from the first end of the leadframe;
forming a second section extending laterally between the second side and the first section; and
preparing a second bond pad proximate to the second end of the leadframe.

9. A method of manufacturing a microelectronic device, comprising:

forming a leadframe, including
forming a first dambar proximate to a first end;
forming a second dambar proximate to a second end, the second dambar being spaced a first distance from the first dambar;
forming a first tie-bar connecting the first and second dambars;
forming a second tie-bar connecting the first and second dambars, the second tie-bar being spaced a second distance from the first tie-bar; and
forming a plurality of leads by forming a first lead extending generally longitudinally from the first dambar to the second dambar, forming a plurality of second leads extending longitudinally from the first dambar to corresponding individual first intermediate locations and laterally between the first tie-bar and the individual first intermediate locations, and preparing bond pads disposed on the plurality of leads proximate the second dambar;

mechanically coupling a die to the leadframe, the mechanically coupling including
disposing the die longitudinally between the bond pads and the first dambar; and
orienting toward the second dambar a plurality of electrical terminals disposed on the die; and
electrically coupling the bond pads and the electrical terminals.

10. The method of claim 9, wherein preparing the bond pads includes plating a portion of at least one of the first and second leads.

11. The method of claim 9, wherein forming the leadframe includes downsetting a die paddle disposed longitudinally between the first and second dambars and latitudinally between the first and second tie-bars.

12. The method of claim 11, wherein mechanically coupling includes adhering the die to the die paddle.

13. The method of claim 9, wherein electrically coupling includes wire bonding.

14. The method of claim 9, further comprising:

trimming the leadframe to remove the first and second dambars; and
trimming the leadframe to remove the first and second tie-bars, the trimming to remove the first and second tie-bars electrically isolates the first and second leads.

15. The method of claim 14, wherein trimming to remove the first and second dambars occurs concurrently with trimming to remove the first and second tie-bars.

16. The method of claim 9, wherein forming the leadframe includes forming a plurality of third leads extending longitudinally from the first dambar to corresponding individual second intermediate locations and laterally between the second tie-bar and the individual second intermediate locations.

* * * * *